United States Patent
Brady et al.

[19]

[11] Patent Number: 5,972,156
[45] Date of Patent: *Oct. 26, 1999

[54] METHOD OF MAKING A RADIO FREQUENCY IDENTIFICATION TAG

[75] Inventors: Michael John Brady, Brewster; Thomas Cofino, Rye; Harley Kent Heinrich, Brewster; Glen Walden Johnson; Paul Andrew Moskowitz, both of Yorktown Heights; George Frederick Walker, New York, all of N.Y.

[73] Assignee: Intermec IP Corp., Cedar Rapids, Iowa

[*] Notice: This patent is subject to a terminal disclaimer.

[21] Appl. No.: 08/915,893

[22] Filed: Aug. 21, 1997

Related U.S. Application Data

[62] Division of application No. 08/303,976, Sep. 9, 1994, Pat. No. 5,682,143.

[51] Int. Cl.⁶ .......................... B32B 31/00; B32B 31/20; G08B 13/14
[52] U.S. Cl. .......................... 156/280; 156/297; 156/300; 340/572
[58] Field of Search .................................... 156/166, 280, 156/297, 300; 340/572, 825.54

[56] References Cited

U.S. PATENT DOCUMENTS

| | | |
|---|---|---|
| 4,674,175 | 6/1987 | Stampfli . |
| 5,448,110 | 9/1995 | Tuttle et al. .................... 340/825.54 X |
| 5,528,222 | 6/1996 | Moskowitz et al. ..................... 340/572 |
| 5,682,143 | 10/1997 | Brady et al. ............................ 340/572 |
| 5,708,626 | 1/1998 | Isaacson et al. ........................ 340/572 |
| 5,786,626 | 7/1998 | Brady et al. . |

FOREIGN PATENT DOCUMENTS

| | | |
|---|---|---|
| 0 595 549 | 5/1994 | European Pat. Off. . |
| 93/18493 | 9/1993 | WIPO . |
| 96/07938 | 3/1996 | WIPO . |

*Primary Examiner*—Curtis Mayes
*Attorney, Agent, or Firm*—Louis J. Percello; Ronald L. Drumheller

[57] ABSTRACT

The invention is a radiofrequency identification tag comprising a semiconductor chip having radio frequency, logic, and memory circuits, and an antenna that are mounted on a substrate. The antenna may be used by the chip to modulate an incident RF signal to transfer information to a base station. The antenna comprises one or more lengths of thin wire that are connected directly to the chip by means of wire bonding. The chip and antenna combination are sealed with an organic film covering.

24 Claims, 6 Drawing Sheets

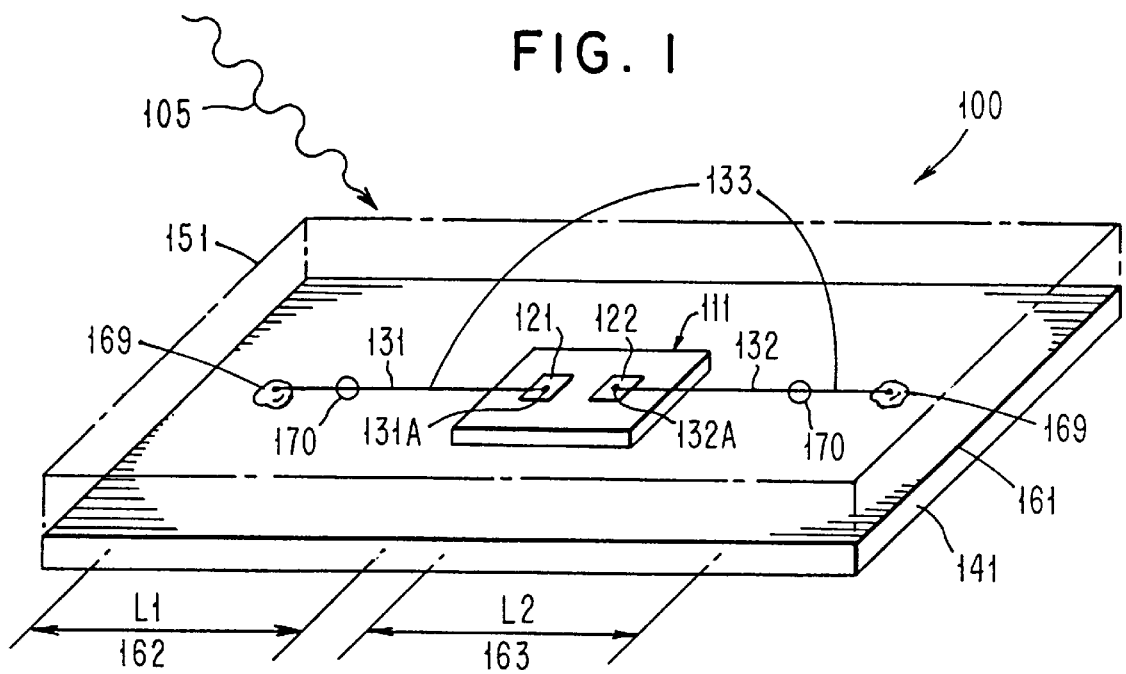
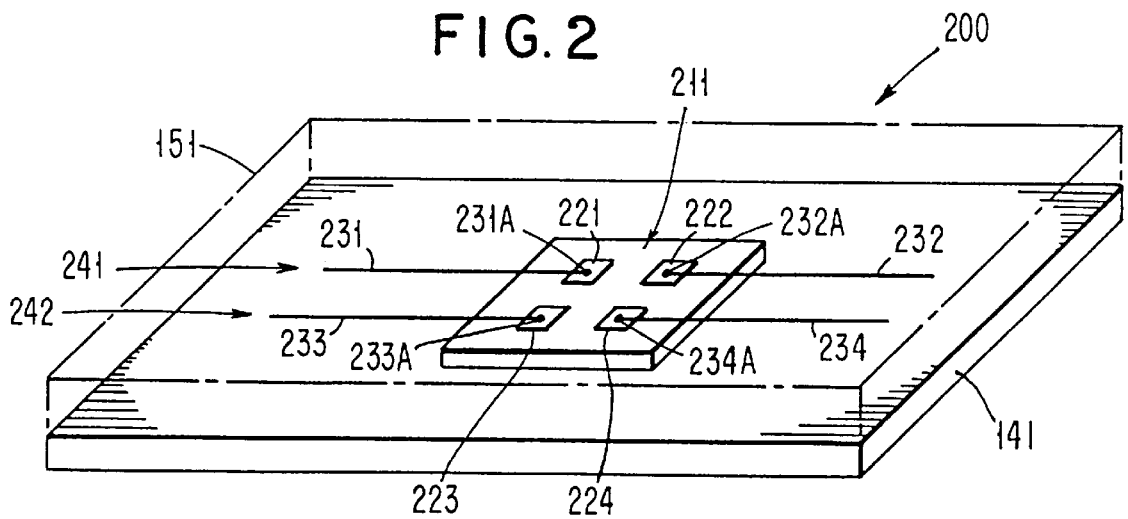

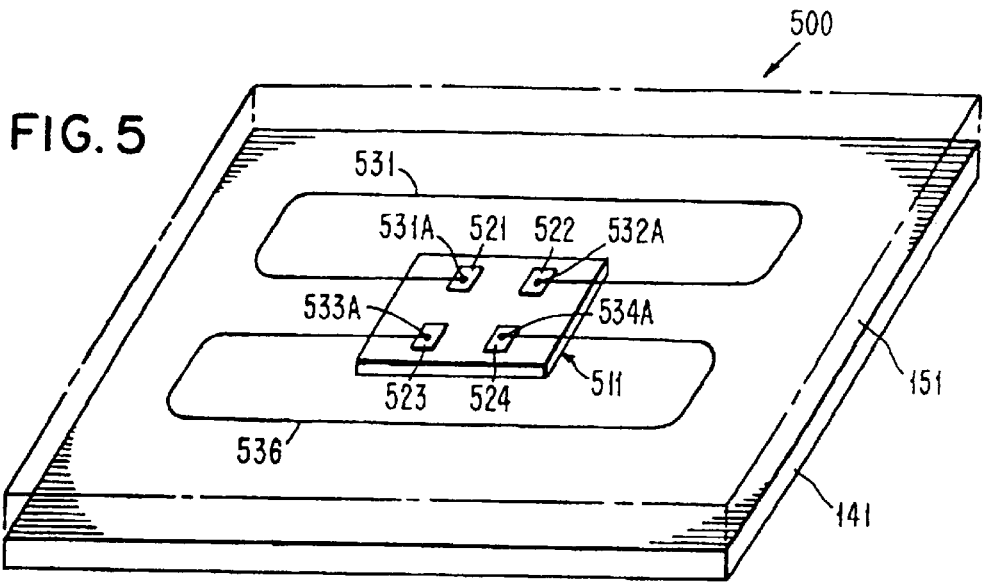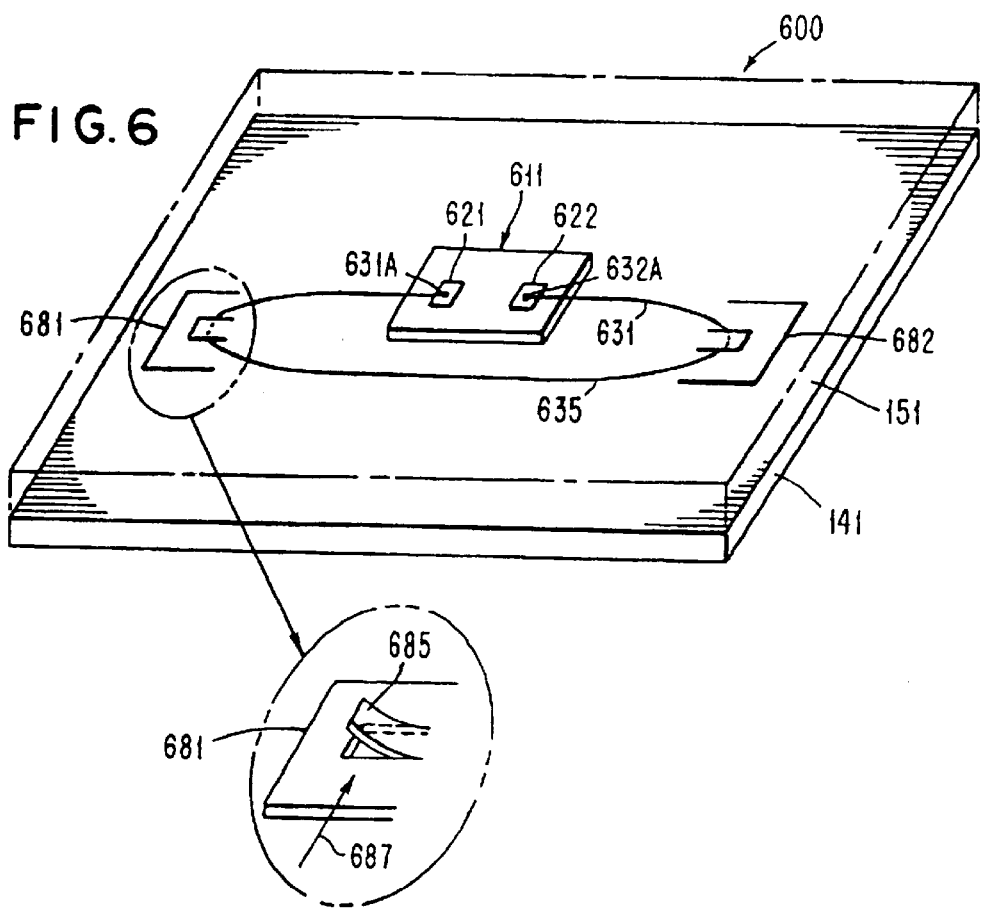

METHOD OF MAKING A RADIO FREQUENCY IDENTIFICATION TAG

This is a divisional application of application Ser. No. 08/303,976, filed Sep. 9, 1994, now U.S. Pat. No. 5,682,143.

FIELD OF THE INVENTION

This invention relates to the field of radio frequency (RF) tagging. More specifically, the invention relates to the making of an improved small size, low cost RF tag that transmits multiple bits of information.

BACKGROUND OF THE INVENTION

In general, circuitry is manufactured on hard printed circuit boards or flexible substrates. Printed circuit boards include materials like epoxy-resin or epoxy-glass boards. One generic class on which these circuits are manufactured is FR4. Alternatively flexible substrates, also called "flex", include structures of copper on polyimide. These circuits are generally used in automobiles, consumer electronics, and general interconnections.

A well known technology for attaching semiconductor circuits, or "chips" to the circuit board or flex structures is called wirebonding. Wire bonds are made from small diameter wires in the range of 25 microns in diameter and are very short. Generally the wire bonds are on the order of 1 millimeter (mm) in length. These wire bonds are normally kept short for several reasons:

1. The small diameter of the wire makes it very weak.
2. In typical circuits many bonds are made and longer lengths would make the connections more prone to electrical shorting.
3. Longer lengths of the wires increase self and mutual inductance which degrade the electrical performance of the circuit.

Radio Frequency Identification (RF ID) is just one of many identification technologies for identifying objects. The heart of the RF ID system lies in an information carrying tag. The tag functions in response to a coded RF signal received from a base station. The tag reflects the incident RF carrier back to the base station. Information is transferred as the reflected signal is modulated by the tag according to its programmed information protocol.

The tag consists of a semiconductor chip having RF circuits, logic, and memory. The tag also has an antenna, often a collection of discrete components, capacitors and diodes, for example, a battery in the case of active tags, a substrate for mounting the components, interconnections between components, and a means of physical enclosure. One variety of tag, passive tags, has no battery. They derive their energy from the RF signal used to interrogate the tag. In general, RF ID tags are manufactured by mounting the individual elements to a circuit card. This is done by using either short wire bond connections or soldered connections between the board and the circuit elements: chip, capacitors, diodes, antenna. The circuit card may be of epoxy-fiberglass composition or ceramic. The antennas are generally loops of wire soldered to the circuit card or consist of metal etched or plated on a circuit card. The whole assembly may be enclosed in a plastic box or molded into a three dimensional plastic package.

While the application of RF ID technology is not as widespread as other ID technologies, barcode for example, RF ID is on its way to becoming a pervasive technology in some areas, notably vehicle identification.

Growth in RF ID has been inhibited by the absence of infrastructure for manufacturing the tags, the high cost of tags, the bulkiness of most of the tags, problems of tag sensitivity and range, and the need for the simultaneous reading of multiple numbers of tags. A typical tag costs in the $5 to $10 range. Companies have focused on niche applications. Some prior art is used to identify railway boxcars. RF tags are now used in the automatic toll industry, e.g. on thruway and bridge tolls. RF tags are being tested for uses as contactless fare cards for buses. Employee identification badges and security badges have been produced. Animal identification tags are also commercially available as are RF ID systems for tracking components in manufacturing processes.

One limitation of making RF tags made from PC boards or flex is that the flex or boards must be manufactured first. For very high volumes of tags (greater than one hundred million tags) new factories must be built to accommodate the capacity needed for board or flex production to meet tag demand. Further, RF tags made from these technologies are too expensive for many applications. For example, bar codes are a technology that is used for identification at a much lower cost than existing RF tagging technology.

OBJECTS OF THE INVENTION

An object of this invention is the making of an improved radio frequency identification tag.

An object of this invention is the making of an improved, low cost radio frequency identification tag that is made from commodity materials.

Another object of this invention is the making of an improved radio frequency identification tag that can be manufactured in very large quantities.

SUMMARY OF THE INVENTION

The present invention is a method of making a novel radio frequency (RF) tag that comprises a semiconductor circuit that has logic, memory, and radio frequency circuits. The semiconductor is mounted on a substrate and is capable of receiving an RF signal through an antenna that is electrically connected to the semiconductor through connections on the semiconductor.

The antenna is novel, has a novel structure, and is constructed by a novel use of wire bonding techniques. The antenna is one or more wires, each connected to the semiconductor connections by one or two wire bonds. (In a preferred embodiment, the antenna is made of a pair or plurality of pairs of wires.) The wire bonding method and resulting structure, rather than having another connection made at the end of a short wire, spools out a length of wire required by the antenna design, and cuts the second end of the wire without making any electrical connection at the second cut end. In some preferred embodiments, the second cut end of the wire is held in place by attaching the cut end to the substrate with adhesive or by local heating of the substrate. In this way, the wire bonding method is used to actually create a component of the RF tag circuit (the antenna) and not merely to connect two components. The resulting novel antenna structure is a long wire connected to the circuit by a wire bond. The components of the novel RF tag are then covered in an organic cover that has a novel use in this type of device.

BRIEF DESCRIPTION OF THE DRAWINGS

FIG. 1 is an isometric drawing of the present invention showing one embodiment of a radio frequency tag with a single antenna.

FIG. 2 is an isometric drawing of the present invention showing one embodiment of a radio frequency tag with multiple antennas.

FIG. 5 is an isometric drawing of one embodiment of the present invention showing a radio frequency tag with multiple loop antennas.

FIG. 6 is an isometric drawing of the present invention showing a radio frequency tag with a single loop antenna, where cutout tabs secure the ends of the antenna.

DETAILED DESCRIPTION OF THE INVENTION

Figure 3:
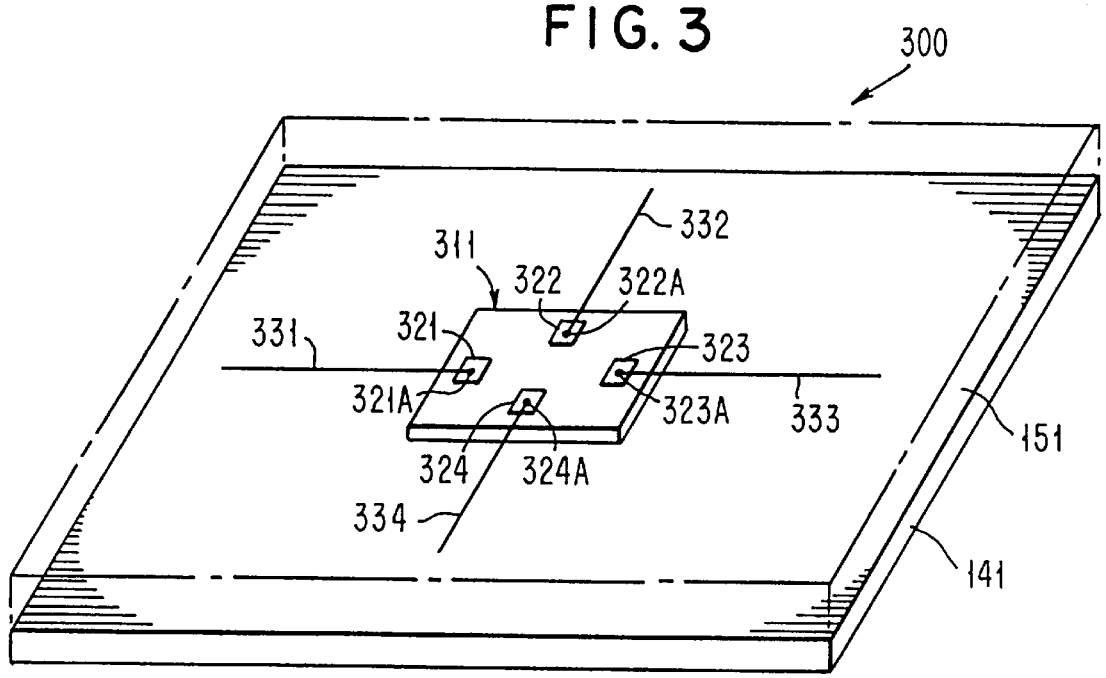
FIG. 3 is an isometric drawing of the present invention showing one embodiment of a radio frequency tag with multiple antennas oriented in a different direction with respect to each other.

FIG. 1 is a drawing of a novel radio frequency tag 100 that is made in accordance with the method of this invention and comprises a substrate 141, a semiconductor circuit or chip 111, a first connection or contact 121, a second connection or contact 122, a first wire 131 bound to the first connection 121 by a bond 131A, and a second wire 132 bound to the second connection 122 by a bond 132A. These components are covered by an organic cover 151 that serves as environmental protection for the antenna 133 comprising wires (131, 132) and bonds (131A, 132A), and circuit 111.

The substrate 141 is made from an organic film. A preferred film is polyester also known as mylar (Mylar is a trademark of Dupont). Another preferred film is polyimide also known as Kapton (Kapton is a trademark of Dupont). Such materials are used as substrates 141 and are well known in the art.

The semiconductor circuit 111 has a memory, logic circuits, and radio frequency (RF) circuits and in a preferred embodiment has no battery. Circuits like this used for RF tags are well known and commercially available. In step 1110 of FIG. 11, the semiconductor circuit or chip can be attached to the substrate by means of adhesive or reflowing the substrate 141 by local heating. The semiconductor also has one or more of connections or contact (121 and 122). The contacts (121 and 122) provide an input and output (I/O) connection to the RF circuitry of the semiconductor. The connections 121 and 122 have an impedance that can be varied by logic in the semiconductor 111. When an RF signal sent to the RF tag is sensed by a circuit in the semiconductor 111, a logic circuit in the semiconductor 111 causes the impedance between the contacts to change according to some pre-programmed logic. This impedance change modulates the RF signal reflected from the RF tag. This modulation allows the RF tag to send information back to a base station which originally sent the RF signal. An antenna connected to the semiconductor 111 plays an essential part in the reception of the RF signal and transmission (reflecting back) of the modulated RF signal. The present invention is a novel antenna and semiconductor structure.

One preferred antenna and semiconductor structure is shown as wires 131 and 132 connected to connections 121 and 122 respectively. In this embodiment the wires are connected by wire bonding (FIG. 11, step 1120) at bond locations 131A and 132A, respectively. While connecting wires with wire bonding is well known, wire bonding techniques heretofore have not been used to create component structures of a circuit as in the present invention. In this invention, the wire bonding creates a novel antenna (FIG. 11, step 1130) and connection structure that matches the transmission (signal reflection) and reception requirements of the semiconductor circuit 111.

Figure 11:
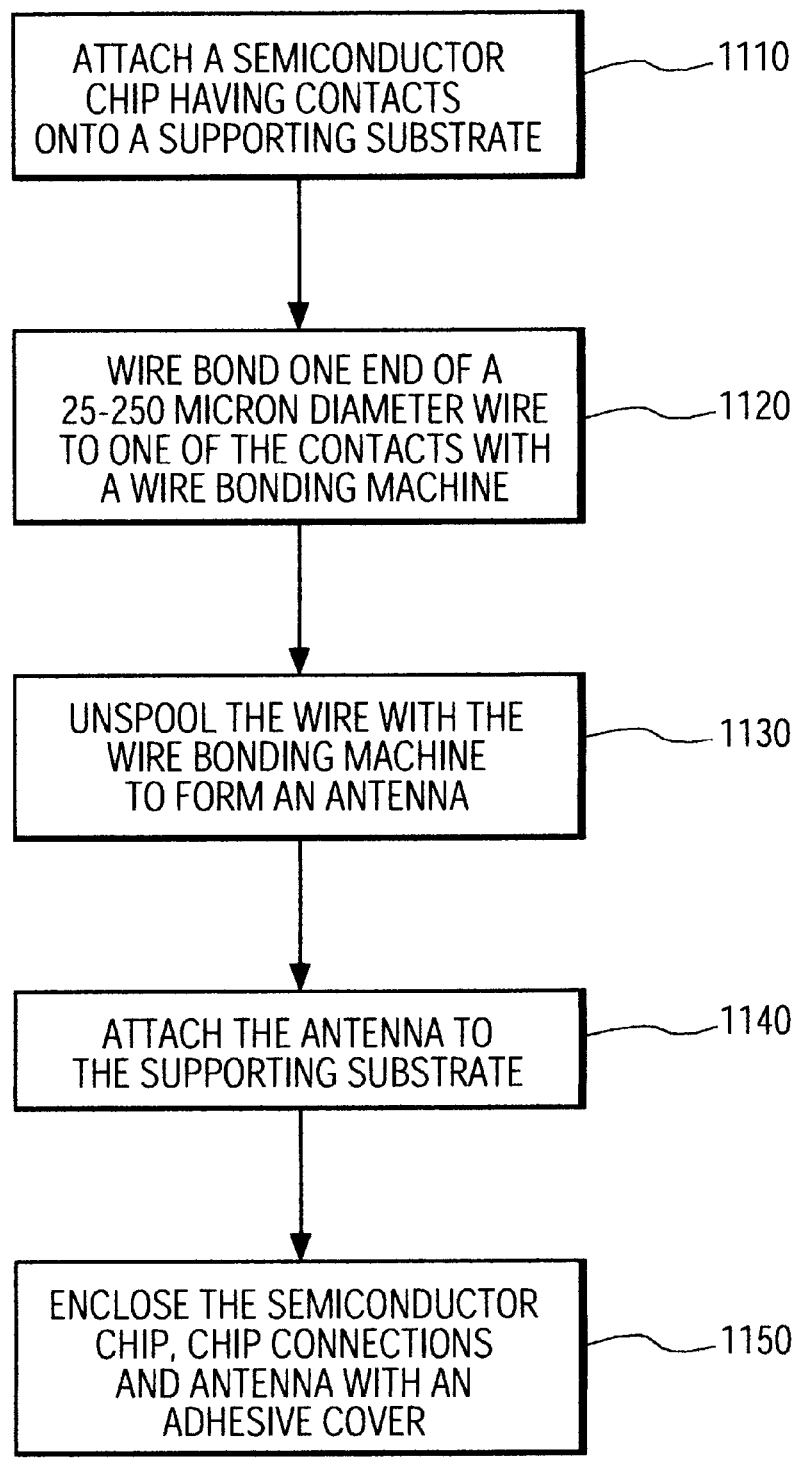
FIG. 11 is a flow chart showing the method steps of the present invention.

In this embodiment, each wire is connected by wire bonding techniques (FIG. 11, step 1120 at one bond connection (131A and 132A, respectively), unspooled to a specified length (FIG. 11, step 1130), and then cut, where the cut end of each wire is left unconnected. The cut can be performed by any well known method used by wire bonding machines, including knife blade (swedge, guillotine), mechanical chopper, mechanical pincers, laser, etc. Furthermore, the wires 131 and 132 can be connected at the bond points (131A and 132A) by means other than wire bonding including: laser, soldering, and conducting epoxy.

The cut end of the wire can be held in place (FIG. 11 step 1140) in several ways. The cut end of the wire can be held in place on the substrate by a small spot of adhesive 169 placed below the cut end. The cut end could also be held in place by locally heating the substrate at the point where the cut end rests so that the substrate becomes sticky and adheres to the cut end. Localized heating of substrates is well known and includes spot application of heat with tools or a laser beam focused at the point of heating. Adhesives are also well known. They include epoxies, silicones, and phenolic-butaryl.

A further way of attaching the cut end to the substrate (FIG. 11, step 1140) involves heating the wire (131, 132) so that the cut end heats up the substrate at the point of contact and causes the cut end to attach to the substrate. The wire can be heated by inductive heating, resistive heating, laser heating, or any other method used for this purpose. Alternatively, a portion of the substrate under the wire can be heated so that part or all of the wire becomes embedded in the substrate. This effect can also be accomplished by heating the wire and applying pressure to part (or all) of the wire so that part (or all of the wire (131, 132) becomes embedded in the substrate.

Using this novel structure, RF tag antenna components can be manufactured by only using commodity materials, i.e., wire used for wire bonds by wire bonding machines and unpatterned organic plastic (like polyester) for the substrate. No circuit boards or patterned flexible substrate material is required. Since only commodity materials (wire and organic plastic) are needed to produce these novel tag structures, large quantities (greater than 100 million) of tags can be manufactured inexpensively without being limited by the existing manufacturing infrastructure.

The length of the wire (131, 132) is determined by the frequency of the RF signal at which the RF tag is to be operated. These frequencies can be any frequency that can be transmitted. However, in a more preferred embodiment, the frequencies lie in a range above 300 Megahertz. In this range of frequencies antenna of reasonable length can be constructed to be resonant. A even more preferred range of frequencies is between 900 Megahertz to 20 Gigahertz. The most preferred frequencies are those permitted for RF tag use by the Federal Communications Commission, some of which include 0.915, 1.92, 2.45, and 5.0 Gigahertz.

To produce a preferred resonant antenna, the lengths (162, 163) of the two wires (131, 132) comprising the antenna are equal. In a preferred embodiment, each of the lengths, (162, 163) is one quarter wavelength long. More specifically, the length of each wire is equal to $(c/4) \times f$, where c is the speed of light and f is the radio frequency 105 that the RF tag is operating at. In practice, the length will be slightly less (by a factor of approximately 5%) to account for capacitance effects. Similarly, the sum of the lengths of 162 plus 163 is one half wavelength, where the total length to be used in practice is $0.95 \times (c/2) \times f$. Hereafter, when a specific length is referred to, it will be the total of the wavelengths (162 plus 163) or a half-wavelength length. A preferred range of total antenna wire (131,132) lengths (162, 163) is between 10 millimeters and 1000 millimeters in length. A more preferred range of antenna wire lengths is between 28 mm and 150 millimeters. Specific preferred lengths (162, 163) of the antenna wires (131, 132) are 150 mm, 74 mm, 58 mm, 28 mm lengths that match the respective frequencies above.

The wire used to construct the antennas is that which is commonly used for short wire bond connections. The wire diameter 170 may be between 25 microns inch and 250 microns (FIG. 11 step 1120). The wire may be composed of aluminum alloy, copper alloy, gold alloy, copper, gold-plated copper or gold. Such wire is commercially available from many sources, e.g., the American Fine Wire Company of Selma, Alabama. Aluminum-alloy wire is preferred because of its low cost. Alternate materials may be chosen based cost, availability, and bondability to the chip contact pads. Use of this type of wire with this diameter in the manufacture of RF tag antennas is thought to be novel.

Adhesive 161 in FIG. 1 secures substrate 141 to cover layer 151 (FIG. 11, step 1150). The adhesive serves to hold the chip and wires in place and to seal the package. By using adhesive over the entire substrate, not just the edges of the package, voids which may accumulate moisture are not allowed to form. Since moisture will accelerate corrosion, the exclusion of moisture will improve the reliability of the package. Adhesives commonly used in the semiconductor industry include epoxies, silicones, and phenolic-butyral. A unique aspect of this package is to use a low-melting point polymer as a preferred adhesive, EVA or ethyl vinyl acetate. EVA is well known in the bookbinding and food industries but its use in the semiconductor industry in RF tag structures is thought to be novel. In various preferred embodiments, the adhesive 161 can be placed locally on the substrate around the components (antenna, semiconductor), or placed on the cover 151 before the cover is placed on the substrate 141.

The antenna (131, 132), the semiconductor 111, and the substrate 141 are encapsulated by a organic cover 151 (FIG. 11, step 1150) using a novel technique for the RF tag art. These components are placed in a laminating machine that applies an organic material (ethyl vinyl acetate) heated enough to become soft and sticky as it is applied with pressure to the structure. In this way, voids in the non-planar surface are filled with the organic material. In a more preferred embodiment, the organic material comprises two layers, one of organic material 151 and another of organic adhesive 161. In this case the heat and pressure are also applied. The heat causes the adhesive to flow to fill the voids on the non-planar surface of the structure. An alternative preferred embodiment uses a pressure sensitive adhesive without the heating.

FIG. 2 is a drawing of a novel radio frequency tag 200 that comprises a substrate 141, a semiconductor circuit 211, a first connection 221, a second connection 222, third connection 223, a fourth connection 224, a first wire 231 bound to the first connection 221 by a bond 231A (FIG. 11, step 1120), and a second wire 232 bound to the second connection 222 by a bond 232A (step 1120), and a third wire 233 bound to the third connection 223 by a bond 233A (step 1120), and a fourth wire 234 bound to the fourth connection 224 by a bond 234A (step 1120). These components are covered by an organic cover 151 that serves as environmental protection for the wires (231–234) and bonds (231A–234A) and circuit 211 (step 1150). These bonds (231A–234A) are wire bonds (step 1120) as described above or their equivalents.

This diagram incorporates more than two wires (231–234) to form multiple sets of antennas (231-232 and 233-234), e.g., antenna 241 comprises wires 231 and 232 and antenna 242 comprises wires 233 and 234. The multiple antennas increase the strength of the signal received by the chip 211 and provide a measure of redundancy. The antennas may be of different lengths in order to be resonant at different frequencies.

FIG. 3 is a drawing of a novel radio frequency tag 300 that comprises a substrate 141, a semiconductor circuit 311, a first connection 321, a second connection 322, third connection 323, a fourth connection 324, a first wire 331 bound 321A to the first connection 221 (step 1120), and a second wire 332 bound 322A to the second connection 322 (step 1120), and a third wire 333 bound 323A to the third connection 323 (step 1120), and a fourth wire 334 bound 324A to the fourth connection 324 (step 1120). These components are covered by an organic cover 151 that serves as environmental protection for the wires (331–334) and bonds (321A–324A) and circuit 311 (step 1150). In the preferred embodiment, the bonds are wire bonds (321A–324A) (step 1120) or their equivalents as described above.

In FIG. 3, the pairs of wires (331, 333 and 332, 334) are arranged in a different, non parallel direction from each other, preferably perpendicular so as to maximize the reception and transmission of radio frequency energy in directions perpendicular to each other. This eliminates nulls in the reception/transmission pattern.

Figure 4:
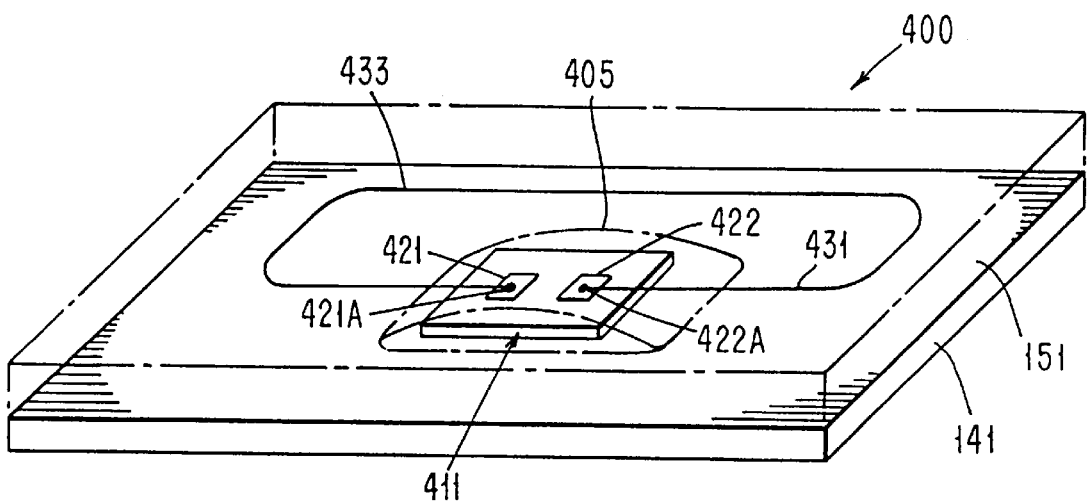
FIG. 4 is an isometric drawing of one embodiment of the present invention showing a radio frequency tag with a single loop antenna.

FIG. 4 is a drawing of a novel radio frequency tag 400 that comprises a substrate 141, a semiconductor circuit 411, a first connection 421, a second connection 422, a wire 431 bound to the first connection 421 by a bond 421A at one end of the wire, and the same wire 431 bound to the second connection 422 by a bond 422A at the other end of the wire 431. These components are covered by an organic cover 151 that serves as environmental protection for the wire 431, bonds (421A, 422A), and circuit 411. In the preferred embodiment, the bonds (421A, 422A) are wire bonds or their equivalent as described above. In another preferred embodiment, a polymeric encapsulant 405 provides a encapsulation for the chip, is used to insulate adjacent conductors from each other, improves vibration and shock resistance, provides mechanical rigidity to the device and connections, and provides protection from atmospheric attack and dust.

Preferably this polymeric encapsulant is opaque to protect light sensitive circuit and forms a thin layer of protection 100 microns (4 mils).

In this diagram, the wire 431 is arranged to form a single loop antenna 433. This antenna will have a higher impedance than that of the antenna 133 (comprising wires 131 and 132 as shown in FIG. 1). It may thus transfer more energy to a high-impedance input circuit on chip 411. The loop is created by moving the wire 431 with the wire bonding tool. In a preferred embodiment, the wire is held in place on the substrate by an adhesive on the substrate to help in the formation of the loop.

FIG. 5 is a drawing of a novel radio frequency tag 500 that comprises a substrate 141, a semiconductor circuit 511, a first connection 521, a second connection 522, a wire 531 bound to the first connection 521 by a bond 531A at one end of the wire, and the same wire 531 bound to the second connection 522 by a bond 532A at the other end of the wire. A second loop antenna is formed with a third connection 523, a fourth connection 524, a wire 536 bound to the third connection 523 by a bond 533A at one end of the wire 536, and the same wire 536 bound to the fourth connection 524 by a bond 534A at the other end of the wire 536. These components are covered by an organic cover 151 that serves as environmental protection for the wires (531, 536) the bonds (531A–534A), and circuit 511. The bonds are wire bonds as described above or their equivalents.

The addition of a second loop antenna increases the sensitivity of the tag by increasing the total strength of the signal received.

FIG. 6 is a drawing of a novel radio frequency tag 600 that comprises a substrate 141, a semiconductor circuit 611, a first connection 621, a second connection 622, a wire 631 bound 631A to the first connection 621 at one end of the wire 631 and the same wire 631 bound 632A to the second connection 622 at the other end of the wire. These components are covered by an organic cover 151 that serves as environmental protection for the wire 631, the bonds (631A and 632A), and circuit 611. The substrate 141 is provided with punched notches 681 and 682 which provide means for retaining the wire at its ends to hold the wire in place during manufacture. A punched notch 681 is cut in the substrate so that it produces a bendable flap 685 which can hold the wire as it is looped. This cut can be produced by a punch tool. An air jet 687 would displace the flap, i.e., bend it from the substrate until the wire could be looped between the bent flap 685 and the remaining substrate.

Figure 7:
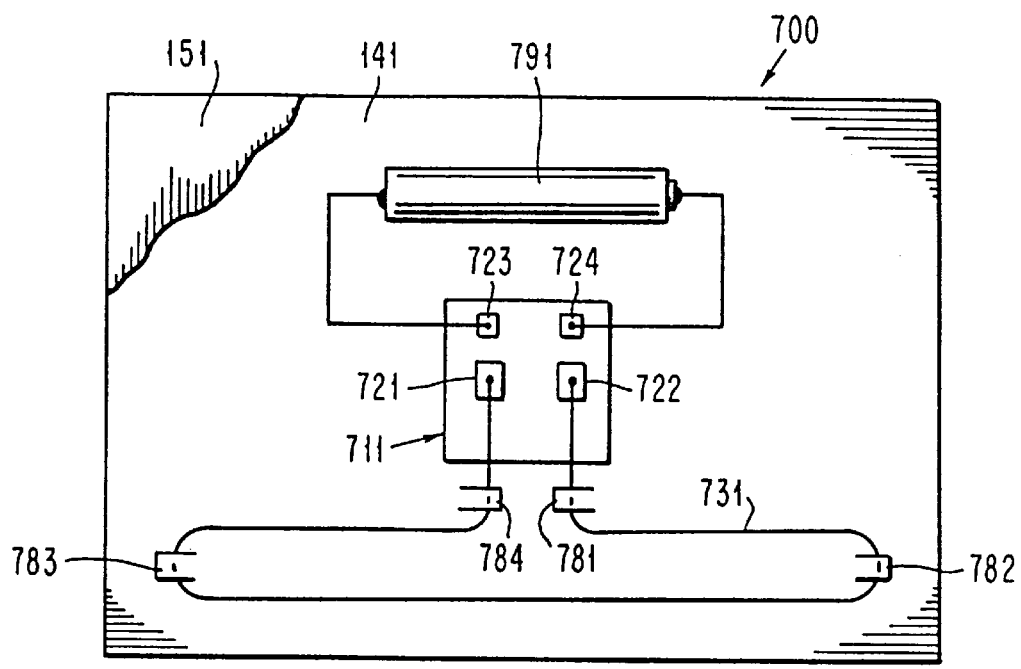
FIG. 7 is a top view drawing of the present invention showing a radio frequency tag with a single loop antenna, where cut out tabs secure locations on the antenna so that the antenna has an orientation in two dimensions.

FIG. 7 is a top view drawing of a novel radio frequency tag 700 that comprises a substrate 141, a semiconductor circuit 711, a first connection 721, a second connection 722, a wire 731 bound to the first connection 721 and the same wire 731 bound to the second connection 722. These components are covered by an organic cover 151 that serves as environmental protection for the wire 731, the bonds, and circuit 711. The substrate 141 is provided with punched flaps 781, 782, 783, and 784 which allow wire 731 to be held in place during manufacture.

Note that the preferred embodiment of the radio frequency tags in this disclosure are passive, i.e., there is no battery on the substrate 141. However, an alternative embodiment is an active tag, as shown in FIG. 7, where a battery 791 is connected to the semiconductor 711 at connections 723, 724 in order to provide on board power to the semiconductor 711.

Figure 8:
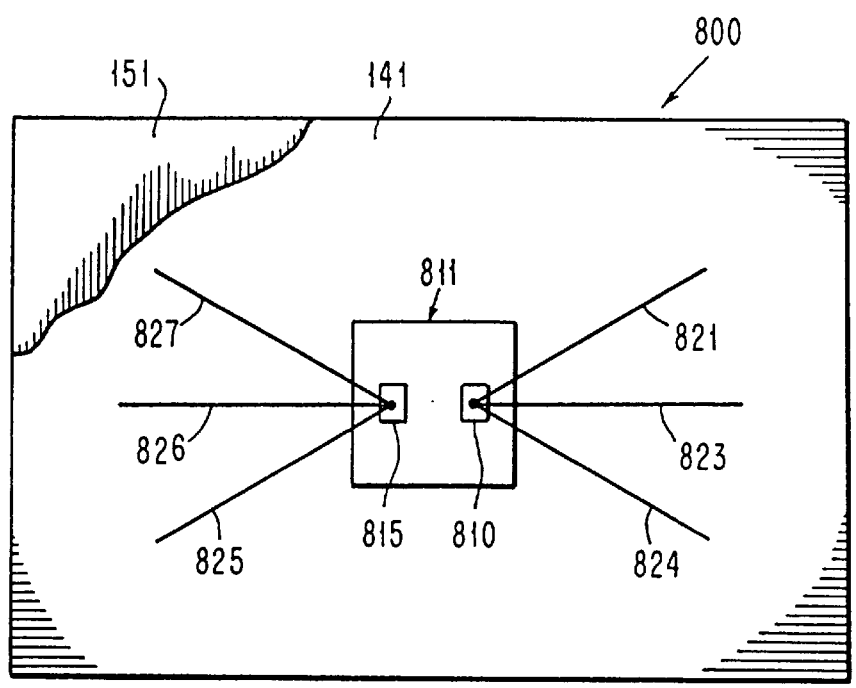
FIG. 8 is a top view drawing of the present invention showing one embodiment of a radio frequency tag with multiple antennas.

FIG. 8 is a top view drawing of a novel radio frequency tag 800 that comprises substrate 141, a semiconductor chip 811, with contacts 810, and 815. Wires 821, 823, and 824 are bonded to contact 810. Wires 825, 826, and 827 are bonded to contact 815. These components are covered by an organic cover 151 that serves as environmental protection for the wires 821, 823, 824, 825, 826, and 827, the bonds and circuit 811.

Figure 9:
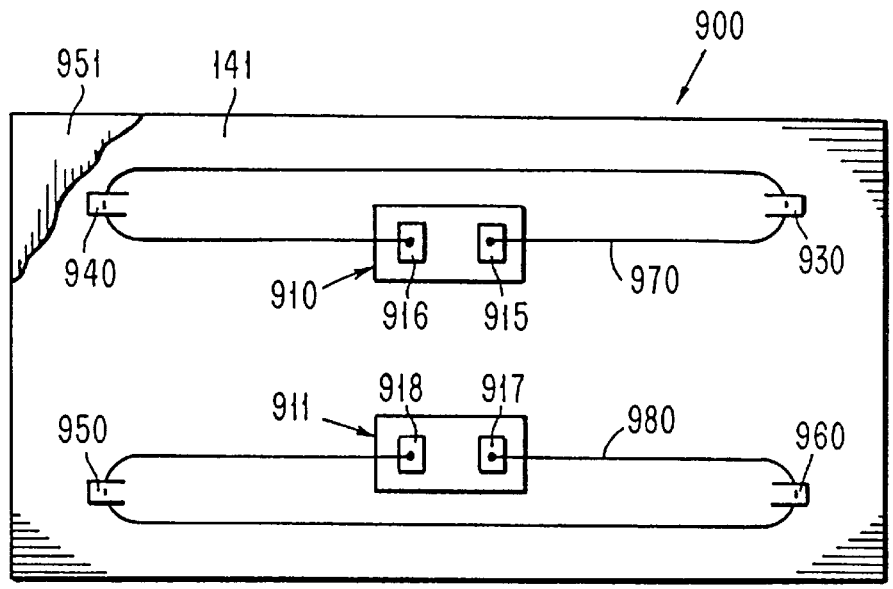
FIG. 9 is a top view drawing of the present invention showing one embodiment of the present invention showing two tags with loop antennas on one substrate.

FIG. 9 is a top view drawing of a novel radio frequency tag 900 that comprises substrate 141, two semiconductor chips 910 (and 911), with contacts 915 and 916 (917 and 918). Wires 970 (and 980), are bonded to contacts 915 and 916 (917 and 918). Wire 970 is connected from contact 915 around punched flaps 930 and 940 to contact 916 in substrate 141. Wire 980 is connected from contact 917 around punched flaps 960 and 950 to contact 918 in substrate 141. These components are covered by an organic cover 951 that serves as environmental protection for wires 970 and 980, the bonds, and circuits 910 and 911.

Figure 10:
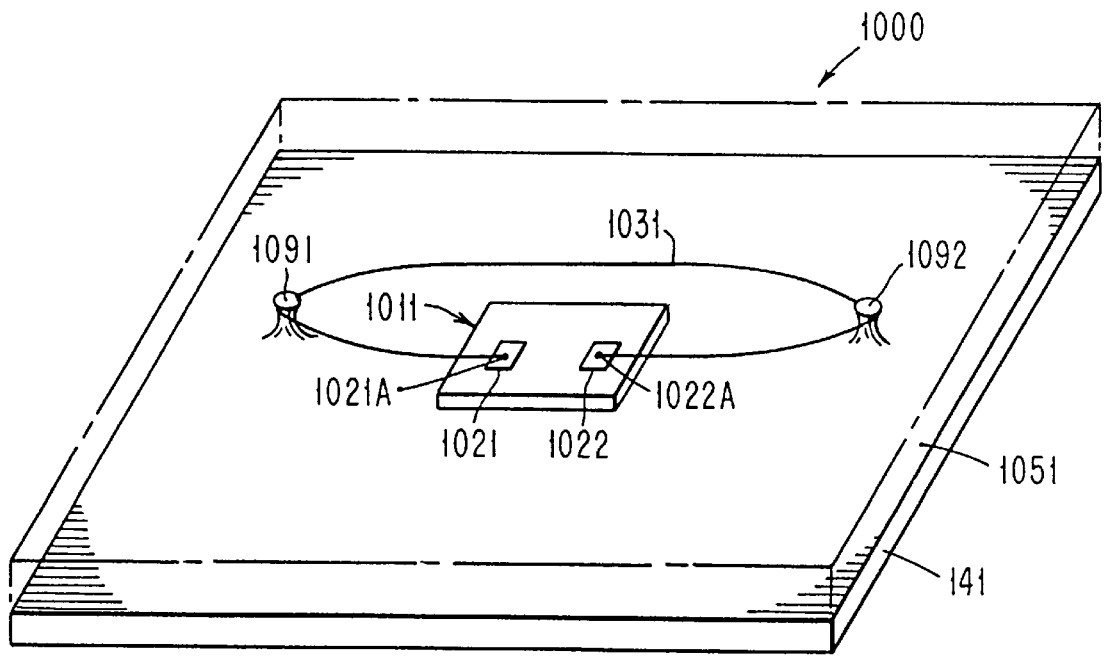
FIG. 10 is an isometric drawing of the present invention showing a radio frequency tag with a single loop antenna, where studs secure the ends of the antenna.

FIG. 10 is a drawing of a novel radio frequency tag 1000 that comprises substrate 141, semiconductor chip 1011 with contacts 1021 and 1022. Wire 1031 is bonded to contact 1021 by bond 1021A and wrapped around embossed pillar 1091 and 1092 and then bonded to contact 1022 by bond 1022A. These components are covered by an organic cover 1051 that serves as environmental protection for wire 1031, the bonds and circuit 1011. The substrate is provided with raised studs or dimples which provide means for retaining the wire at its ends to hold the wire in place during manufacture while the wire 1031 is looped. The studs can be made using a heated die or punch to make part of the substrate deform to the die contour so that the stud or dimple (1091, 1092) protrudes above the surface of the substrate. This technique and equivalents are common in the art, e.g. the embossing techniques used to create raised letters on a plastic credit card. The studs may also be created by adding a preformed piece to the substrate. One preferred added piece would be a molded plastic.

In a more preferred embodiment, pillars 1091 and 1092 are made with a tool that deforms the substrate 141 at an acute angle with the substrate so that the angle opens away from the chip 1011. In this way the wire 1031 will not slip off of the pillars 1091 and 1092 before the cover 1051 is applied. In an alternative preferred embodiment, the pillars 1091 and 1092 are made so that the tops are larger in diameter than the bottoms (the portion closest to the top surface of the substrate.) This can be done by applying pressure on the tops of the pillars to flare the top.

It is evident that one skilled in the art given this disclosure could develop equivalent embodiments which are also within the contemplation of the inventors.

We claim:

1. An improved method of making a radio frequency tag which includes a semiconductor device with at least one pair of contacts and an antenna electrically connected to at least one pair of said at least one pair of contacts, the semiconductor device modulating and retransmitting a radio frequency signal received by the antenna, the improved method comprising the steps of:

attaching said semiconductor device to a supporting substrate;

forming said antenna entirely of at least one wire having a diameter in the range of 25 microns to 250 microns by spooling wire from and positioning the spooled wire with a wire bonding machine;

wire bonding said antenna to at least one pair of said at least one pair of contacts of said semiconductor device using said wire bonding machine; and attaching said antenna for support to said supporting substrate.

2. The improved method of claim 1 wherein said semiconductor device is attached to said supporting substrate by a chip-attaching adhesive.

3. The improved method of claim 1 wherein said antenna is attached to said supporting substrate by a wire-attaching adhesive.

4. The improved method of claim 1 and further comprising the step of encapsulating said semiconductor device and said contact.

5. The improved method of claim 1 and further comprising the step of attaching a top cover to said supporting substrate to entirely enclose said semiconductor device and said antenna between said supporting substrate and said top cover.

6. The improved method of claim 5 wherein said top cover is formed of an organic material.

7. The improved method of claim 5 wherein said top cover includes an outer layer and an inner layer, said outer layer being an organic film and said inner layer being a cover adhesive.

8. The improved method of claim 5 wherein said top cover is attached to said supporting substrate using heat.

9. The improved method of claim 8 wherein said top cover is attached to said supporting substrate using pressure in addition to said heat.

10. The improved method of claim 1 wherein said antenna is formed of a single length of wire spooled from said wire bonding machine.

11. The improved method of claim 1 wherein more than one said radio frequency tag is formed on a single supporting substrate.

12. An improved method of making a radio frequency tag which includes a semiconductor device having at least two contacts and an antenna electrically connected at least to two contacts of said at least two contacts, the semiconductor device modulating and retransmitting a radio frequency signal received by the antenna, the improved method comprising the steps of:

attaching said semiconductor device to a supporting substrate;

forming said antenna entirely of wire having a diameter in the range of 25 microns to 250 microns by spooling wire from and positioning the spooled wire with a wire bonding machine;

wire bonding ends of said antenna to said two contacts of said at least two contacts of said semiconductor device using said wire bonding machine; and attaching said antenna for support to said supporting substrate.

13. An improved method of making a radio frequency tag which includes a semiconductor device having two contacts and an antenna electrically connected to said two contacts, the semiconductor device modulating and retransmitting a radio frequency signal received by the antenna, the improved method comprising the steps of:

attaching said semiconductor device to a supporting substrate;

forming said antenna entirely of wire having a diameter in the range of 25 microns to 250 microns by spooling wire from and positioning the spooled wire with a wire bonding machine;

wire bonding ends of said antenna to said two contacts of said semiconductor device using said wire bonding machine; and attaching said antenna for support to said supporting substrate.

14. The improved method of claim 13 wherein said semiconductor device is attached to said supporting substrate by a chip-attaching adhesive.

15. The improved method of claim 13 wherein said antenna is attached to said supporting substrate by a wire-attaching adhesive.

16. The improved method of claim 13 and further comprising the step of encapsulating said semiconductor device and said two contacts.

17. The improved method of claim 13 and further comprising the step of attaching a top cover to said supporting substrate to entirely enclose said semiconductor device and said antenna between said supporting substrate and said top cover.

18. The improved method of claim 17 wherein said top cover is formed of an organic material.

19. The improved method of claim 17 wherein said top cover includes an outer layer and an inner layer, said outer layer being an organic film and said inner layer being a cover adhesive.

20. The improved method of claim 17 wherein said top cover is attached to said supporting substrate using heat.

21. The improved method of claim 20 wherein said top cover is attached to said supporting substrate using pressure in addition to said heat.

22. The improved method of claim 13 wherein said antenna is formed of a single length of wire spooled from said wire bonding machine.

23. The improved method of claim 13 wherein said antenna is formed of a plurality of lengths of wire all spooled from said wire bonding machine.

24. The improved method of claim 13 wherein said antenna includes a length of wire spooled from said wire bonding machine, said length of wire having two ends and said two ends of said wire being wire bonded respectively to different ones of said two contacts of said semiconductor device using said wire bonding machine.

* * * * *